United States Patent
Takashima

(10) Patent No.: US 6,574,133 B2
(45) Date of Patent: Jun. 3, 2003

(54) NONVOLATILE FERROELECTRIC MEMORY DEVICE HAVING DUMMY CELL CIRCUIT

(75) Inventor: Daisaburo Takashima, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/945,755

(22) Filed: Sep. 5, 2001

(65) Prior Publication Data

US 2002/0027797 A1 Mar. 7, 2002

(30) Foreign Application Priority Data

Sep. 5, 2000 (JP) .......................... 2000-269223

(51) Int. Cl.[7] .............................. G11C 11/22
(52) U.S. Cl. .................. 365/145; 365/210; 365/209; 365/226; 365/229
(58) Field of Search ................ 365/145, 210, 365/209, 206, 229, 226

(56) References Cited

U.S. PATENT DOCUMENTS

| | | | | |
|---|---|---|---|---|
| 5,541,885 A | * | 7/1996 | Takashima | 365/226 |
| 5,610,540 A | * | 3/1997 | Althoff et al. | 327/51 |
| 5,903,492 A | | 5/1999 | Takashima | 365/145 |
| 5,917,365 A | * | 6/1999 | Houston | 327/534 |
| 2002/0027797 A1 | * | 3/2002 | Takashima | 365/145 |
| 2002/0061604 A1 | * | 5/2002 | Sitaram et al. | 438/3 |

FOREIGN PATENT DOCUMENTS

| | | | | |
|---|---|---|---|---|
| JP | 11-251534 | * | 9/1999 | H01L/27/10 |
| JP | 2000-349251 | * | 12/2000 | H01L/27/10 |

OTHER PUBLICATIONS

T. Miyakawa et al., "MP6.2 A 0.5μm 3V 1T1C 1Mb FRAM with a Variable Reference Bitline Voltage Scheme using a Fatigue–Free Reference Capacitor", 1999 IEEE International Solid–State Circuits Conference, pp. 104–105.

Y. Chung et al. "a 3.3–V 4–Mb Nonvolatile Ferroelectric RAM with a Selectively–Driven Double–Pulsed Plate Read/Write–Back Scheme", 1999 Symposium on VLSI Circuits Digest of Technical Papers, pp. 97–98.

* cited by examiner

Primary Examiner—Andrew Q. Tran
(74) Attorney, Agent, or Firm—Banner & Witcoff, Ltd.

(57) ABSTRACT

A dummy cell circuit, used in semiconductor memory capable of high-speed operation without inviting enlargement of the chip size even when using a paraelectric capacitor, includes at least one paraelectric capacitor and have a specific relation between potentials applied to its terminals. For example, in a standby mode, a first terminal of the paraelectric capacitor is precharged to a first potential higher than ground potential whereas a second terminal of the paraelectric capacitor is pre-charged to ground potential. In an active mode, the first terminal is connected to one of paired bit lines, which is a reference bit line to which data is not read-out from memory cell, and the second terminal is raised from ground potential to a second potential higher than ground potential.

27 Claims, 19 Drawing Sheets

NONVOLATILE FERROELECTRIC MEMORY DEVICE HAVING DUMMY CELL CIRCUIT

CROSS REFERENCE TO RELATED APPLICATIONS

This application is based upon and claims the benefit of priority from the prior Japanese Patent Application No. 2000-269223 filed on Sep. 5, 2000, the entire contents of which are incorporated herein by reference.

BACKGROUND OF THE INVENTION

This invention relates to a semiconductor memory device and, more particularly, to a nonvolatile ferroelectric memory device.

Semiconductor memory is currently used in all electric products including main memory devices of large-scale computers, personal computers, household electric appliances, cellular phones and others.

Various kinds of semiconductor memory such as volatile DRAM (dynamic RAM), SRAM (static RAM), nonvolatile MROM (mask ROM), flash EEPROM (electrically erasable programmable memory), and so on, are commercially available. Among those, DRAM is volatile but currently occupies almost all of the market because of its advantages in the sense of its cell area being ¼ as compared with SRAM and its speediness equivalent to flash EEPROM.

On the other hand, since electrically erasable programmable flash EEPROM is nonvolatile, it permits cut of power. However, it involves such drawbacks that, for example, the rewritable frequency (W/E frequency) is in the order of only $10^6$, and therefore it takes the order of micro seconds for writing and a high voltage (12V through 22V) is required for writing, its market is not yet so wide as that of DRAM.

In contrast, nonvolatile memory using a ferroelectric capacitor (ferroelectric memory) has been under development by various manufacturers since it was proposed in 1980 because it has advantages, namely, nonvolatility, rewritable frequency as high as $10^{12}$, read and write time equivalent to that of DRAM, operability under 3V through 5V, and so on, and it might possibly replace the entire memory market.

FIG. 18 shows a conventional ferroelectric memory cell MC1 having one-transistor and one-capacitor, its cell array, sense amplifier and dummy cell circuit. FIG. 19 is a timing chart showing their behaviors.

As apparent from FIG. 18, each memory cell of the conventional ferroelectric memory is made up of a transistor and a capacitor connected in series. A cell array is a matrix arrangement of such memory cells, and includes bit lines/BL, BL for reading data, word lines WL0, WL1 for selecting a memory cell transistor, and plate lines PL0, PL1 each for driving one end of a ferroelectric capacitor. The sense amplifier is connected to the bit lines, and the dummy cell circuit is disposed symmetrically to the memory cell.

Behaviors of the ferroelectric memory are explained with reference to FIG. 19.

In an active mode where the memory cell MC1, for example, has been selected, the word line WL0 connected to MC1 is HIGH and the plate line PL0 is HIGH. As a result, memory cell data is read out to one of a pair of bit lines pre-charged to VSS. In case of this example, cell data is read out to the bit line /BL (/BLSA), and the potential of the bit line rises. If the memory cell data is "1", then polarization of the ferroelectric capacitor is reversed, and the bit line is raised to a high potential. If the memory cell data is "0", then polarization reversal does not occur, but potential of the bit line rises as much as the paraelectric component of the ferroelectric capacitor and the capacitance ratio of the bit line capacitance.

In this manner, although the bit line potential rises from Vss for both data "1" and "0", there is a difference between the potentials. Therefore, if the reference bit line BL (BLSA) can be adjusted to an intermediate potential between those potentials, it is possible to determine whether the cell data is "1" or "0" by amplifying the difference between the bit line and the reference bit line with the sense amplifier.

Conventionally, potential of the reference bit line was generated using a dummy cell circuit as shown in FIG. 18. In a standby mode, the transistors Q1 and Q2, in which dummy word lines SWL0, DWL1 are connected to gates, are turned OFF, and one end N1 of the paraelectric capacitor C1 is pre-charged to the source potential of Q3, i.e. Vss, by turning the transistor Q3 ON. In an active mode, a transistor of a dummy word line connected to the reference bit line, which is the transistor Q1 in this example, is turned ON to connect BL and N1, and then the potential of the dummy plate line, which is the other end of C1, is raised from Vss to VDC potential. Through these operations, potential Vref of reference BL can be raised from Vss to the intermediate potential between those corresponding to "1" and "0" data by coupling of the paraelectric capacitor C1.

However, the dummy cell circuit system of FIG. 18, reviewed above, involved the following problems. For example, in the 0.5 μm rule class, the bit line capacitance CB is about 1000 fF. In case a memory cell capacitor having the area of 3 μm² is used, if the potential at the HIGH side of the bit line amplitude is 3V (=Vaa), then the read-out potential to the bit line of "1" data is about 1.2 V in average of all cells whereas the read-out potential to the bit line of "0" data is about 0.4 V in average of all cells. Therefore, 0.8 V is required as the reference bit line potential, and taking account of fluctuation of ferroelectric capacitors, a reference potential to the level of 1.5 V (=½ Vaa) including estimation for distribution is required.

In order to generate the reference bit line potential of ½ Vaa by using the conventional dummy cell circuit shown in FIG. 18, a very large paraelectric capacitor is required. Its reason will be explained below.

FIG. 20 shows value of reference bit line potential Vref under the condition in which the capacitance of the paraelectric capacitor C1 of the dummy cell circuit is CD, bit line capacitance is CB, and source potential for the dummy cell is VDC ((0<VDC≦Vaa): here let the maximum value be Vaa). The reference bit line potential is a value obtained by dividing VDC×CD, which is the charge of the surplus for raising the paraelectric capacitor CD from Vss to VDC, by the total capacitance (CB+CD). Therefore, to obtain ½ Vaa potential, a large paraelectric capacitor capacitance CD (=1000 fF) equal to the bit line capacitance CB is required. Then, if MOS capacitors of 8 nm are used, a dummy cell capacitor as large as 225 μm² is required, and the chip size will increase significantly. More specifically, to generate Vref of 1 V, capacitance as large as CD=½CB is required, and to generate of Vref of ½ Vaa or more, CB<CD. Thus, CD itself becomes a load capacitance, and there is a large difficulty.

These problems were conventionally avoided by using two other methods.

On of these methods uses a ferroelectric capacitor used in a memory cell to make up such a dummy capacitor without using a paraelectric capacitor such as MOS capacitor having a small dielectric constant. With this method, since the ferroelectric material has a very large dielectric constant, a small dummy cell circuit can be realized.

This method, however, involves the following drawbacks, among others, 1) capacitance value of the ferroelectric capacitor itself largely fluctuates;
2) the ferroelectric capacitor changes in value due to fatigue if it is subjected to polarization reversal;
3) capacitance value of the ferroelectric material decreases when polarization takes place; and
4) characteristic of the ferroelectric capacitor changes due to generation of imprint. So, it is preferable that the paraelectric capacitor is usable.

The second of those methods raises the plate potential in the read-out mode to bring about polarization reversal of the memory cell and read out a signal, and uses the bit line potential after being lowered to Vss as the read-out potential.

In this case, since the plate line potential returns to the original value beforehand, there is the effect that no paraelectric component of the memory cell capacitor is recognized. Therefore, both the "1" data potential and "0" data potential become low potentials, and a dummy cell even of a small paraelectric capacitor can generate a sufficient reference bit line potential.

This method, however, involved the following drawbacks.

1) since sense-amplifying operation takes place after the plate line is raised and lowered, random access time becomes very long, and
2) since it needs operations of again raising and lowering the plate line upon re-writing data, it results in raising and lowering the plate line twice, and cycle time becomes very long.

The Inventor has already proposed, in U. S. Pat. No. 5,903,492, as nonvolatile ferroelectric memory, a new type of ferroelectric memory simultaneously satisfying three requirements, namely, (1) memory cell of a small size,
(2) planar transistor easy to manufacture, and
(3) versatile random access function.

FIG. 21 shows configuration of that earlier ferroelectric memory, and FIG. 22 shows an example of its operations. Since that earlier invention also uses the same read-out principle as the conventional ferroelectric memory, it similarly uses the dummy cell circuit shown in FIG. 21, which is similar to FIG. 18, for generating the reference bit line potential.

In its standby mode, the transistors Q1, Q2 of the dummy word lines are turned OFF and the transistor Q3 is held ON, one end N1 of the paraelectric capacitor C1 is pre-charged to the source potential of Q3, i.e. vss potential.

In an active mode, a transistor of a dummy word line connected to the reference bit line, which is the transistor Q1 in this example, is turned ON to connect BL and N1, and then the potential of the dummy plate line, which is the other end of C1, is raised from Vss to VDC potential. Through these operations, potential Vref of reference BL can be raised from Vss to the intermediate potential between those corresponding to "1" and "0" data by coupling of the paraelectric capacitor C1.

Therefore, also in the earlier application, problems shown in FIGS. 19 and 20 occur. As compared with the conventional ferroelectric memory, the bit line capacitance in the earlier application is about ¼ per cell, and the number of cells for each sense amplifier (bit line) can be increased to 4 times. In this case, the number of dummy cell circuits themselves can be reduced to ¼, and influences of the area of the dummy cells are not so large as the conventional ferroelectric memory. Nevertheless, it still occupies several % of the chip area, and reduction of the dummy cell area is desirable. For example, in case the number of cells per bit line is ½ and a reduced amount of CB is used for enhancing signals, CB is about 500 fF in the 0.5 $\mu$m rule class, and in case a memory cell capacitor with the are of 3 $\mu m^2$ is used and the HIGH side potential of the bit line amplitude is 3V (=Vaa), the read-out potential to the bit line of "1" data is about 1.5 V in average of all cells and the read-out potential to the bit line of "0" data is about 0.5 V in average of all cells. Therefore, 1 V is required as the reference bit line potential, and taking account of fluctuation of ferroelectric capacitors, a reference potential to the level of 1.5 V (=½ Vaa) is required. In order to generate the reference bit line potential of ½ Vaa by using the conventional dummy cell circuit as shown in FIG. 21, a very large paraelectric capacitor as shown in FIG. 20 is required similarly to the conventional ferroelectric memory. To obtain ½ Vaa potential, a large paraelectric capacitor capacitance CD (=500 fF) of the same value as the bit line capacitance CB has to be used . Then, if MOS capacitors of 8 nm are used, a dummy cell capacitor as large as 112 $\mu m^2$ is required, and the chip size will increase significantly. Also for generating Vref of 1 V, capacitance as large as CD=½CB is required, and for generating of Vref of ½ Vaa or more, CB<CD. Thus, CD itself becomes a load capacitance, and there is a large difficulty.

As reviewed above, the conventional ferroelectric memory and the ferroelectric memory of the earlier application involved the problem of an increase of the chip size because of the need for a large capacitor area when using a paraelectric capacitor to generate a high reference bit line potential. The method of generating the reference bit line potential by using a ferroelectric capacitor to remove that problem involved problems of variance, deterioration, decrease and fluctuations, and involved the problems of undesirable change in reference bit line potential and a decrease of the signal read-out margin. Additionally, although there is a method for avoiding the problems by raising and lowering the plate line twice and thereby lowering the reference bit line potential, the method had the problem of a slow operation.

SUMMARY OF THE INVENTION

According to an embodiment of the invention, there is provided a semiconductor memory device comprising:

a plurality of memory cell blocks each including a serial connection of at least a plurality of memory cells each including a cell transistor and a ferroelectric capacitor connected in parallel between source and drain terminals of said cell transistor;

a plurality of word lines connected to said cell transistors;

a plurality of bit line pairs connected to said memory cell blocks;

a plurality of amplifier circuits connected to said bit line pairs to amplify a signal difference between bit lines in each of said bit line pair; and a dummy cell circuit to generate a potential for one of said bit line pair, which is a reference bit line to which data is not read out from said memory cells, said dummy cell circuit including at least one paraelectric capacitor;

wherein in a standby mode, a first terminal of said paraelectric capacitor is pre-charged to first potential higher than ground potential, and a second terminal of said paraelectric capacitor is pre-charged to ground potential; and in an active mode, said first terminal is connected to said reference bit line, and said second terminal is raised from ground potential to a second potential higher than ground potential.

According to another embodiment of the present invention, there is provided A semiconductor memory device comprising:

a plurality of memory cell blocks each including a serial connection of at least a plurality of memory cells each including a cell transistor and a ferroelectric capacitor connected in parallel between source and drain terminals of said cell transistor;

a plurality of word lines connected to said cell transistors;

a plurality of bit line pairs connected to said memory cell blocks;

a plurality of amplifier circuits connected to said bit line pairs to amplify a signal difference between bit lines in each of said bit line pair; and a dummy cell circuit including a first dummy cell portion having a first paraelectric capacitor to generate a first potential of a first bit line of said bit line pair and a second dummy cell portion having a second paraelectric capacitor to generate a second potential of a second bit line of said bit line pair, wherein a first terminal of the first paraelectric capacitor is connected to the first bit line via a first transistor and to a first dummy cell power supply potential via a second transistor, and a second terminal of the first paraelectric capacitor is connected to a first dummy plate line, and a first terminal of the second paraelectric capacitor is connected to the second bit line via a third transistor and to a second dummy cell power supply potential via a fourth transistor, and a second terminal of the second paraelectric capacitor is connected to a second dummy plate line.

According to further embodiment of the present invention, there is provided a semiconductor memory device comprising:

a plurality of memory cells made up of a serial connection of cell transistors and ferroelectric capacitors;

a plurality of word lines connected to said cell transistors;

a plurality of bit line pairs connected to said memory cells;

a plurality of amplifier circuits connected to said bit line pairs to amplify a signal difference between bit lines in each said bit line pair; and a dummy cell circuit for generating a potential in one of bit lines in each said bit line pair, which is a reference bit line to which data is not read out from memory cells, said dummy cell circuit having at least one paraelectric capacitor;

wherein in a standby mode, a first terminal of said paraelectric capacitor being pre-charged to a first potential higher than ground potential, and a second terminal of said paraelectric capacitor being pre-charged to ground potential; and in an active mode, said first terminal being connected to said reference bit line, and said second terminal being raised from ground potential to a second potential higher than ground potential.

According to still further embodiment of the present invention, there is provided a semiconductor memory device comprising:

a plurality of memory cells each including a serial connection of a cell transistor and a ferroelectric capacitor;

a plurality of word lines connected to said cell transistors;

a plurality of bit line pairs connected to said cell transistors;

a plurality of amplifier circuits connected to said bit line pairs to amplify a signal difference between bit lines in each of said bit line pair; and a dummy cell circuit to generate a potential for one of said bit line pair, which is a reference bit line to which data is not read out from said memory cells, said dummy cell circuit including at least one paraelectric capacitor;

wherein in a standby mode, a first terminal of said paraelectric capacitor is pre-charged to first potential higher than ground potential, and a second terminal of said paraelectric capacitor is pre-charged to ground potential; and in an active mode, said first terminal is connected to said reference bit line, and said second terminal is raised from ground potential to a second potential higher than ground potential.

According to yet further embodiment of the present invention, there is provided a semiconductor memory device comprising:

a plurality of memory cells each including a serial connection of a cell transistor and a ferroelectric capacitor;

a plurality of word lines connected to said cell transistors;

a plurality of bit line pairs connected to said memory cell blocks;

a plurality of amplifier circuits connected to said bit line pairs to amplify a signal difference between bit lines in each of said bit line pair; and a dummy cell circuit including a first dummy cell portion having a first paraelectric capacitor to generate a first potential of a first bit line of said bit line pair and a second dummy cell portion having a second paraelectric capacitor to generate a second potential of a second bit line of said bit line pair, wherein a first terminal of the first paraelectric capacitor is connected to the first bit line via a first transistor and to a first dummy cell power supply potential via a second transistor, and a second terminal of the first paraelectric capacitor is connected to a first dummy plate line, and a first terminal of the second paraelectric capacitor is connected to the second bit line via a third transistor and to a second dummy cell power supply potential via a fourth transistor, and a second terminal of the second paraelectric capacitor is connected to a second dummy plate line.

DESCRIPTION OF THE PREFERRED EMBODIMENTS

With reference to the drawings, embodiments of the invention will be described below.

Figure 1:
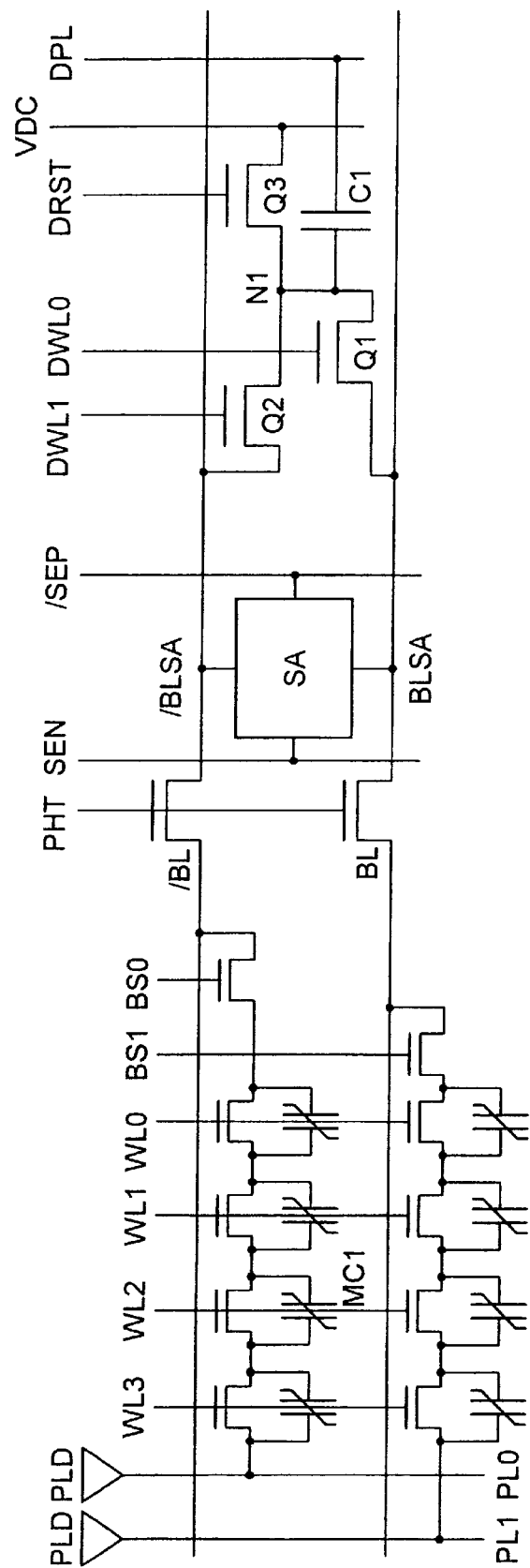
FIG. 1 is a circuit diagram that shows configuration of an array, sense amplifier and dummy cell circuit of ferroelectric memory according to the first embodiment of the invention.
Figure 2:
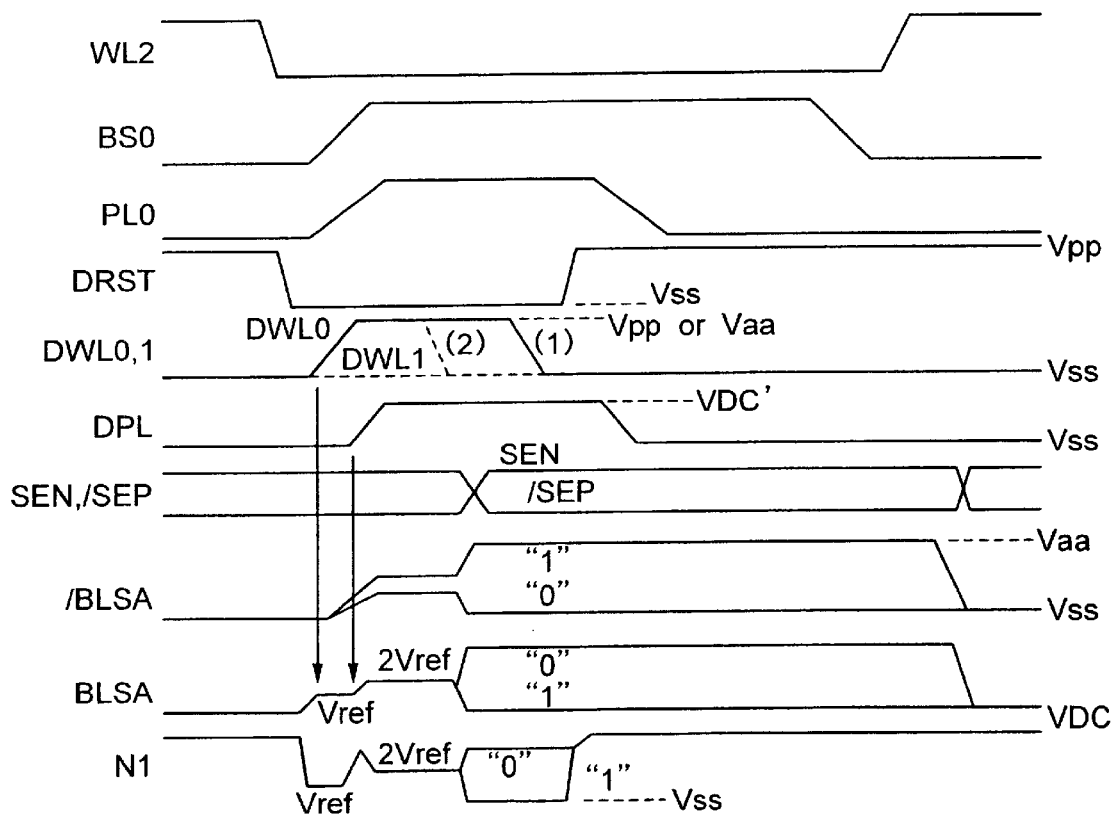
FIG. 2 is a timing chart that shows an example of operation timing of the configuration of FIG. 1.
Figure 3:
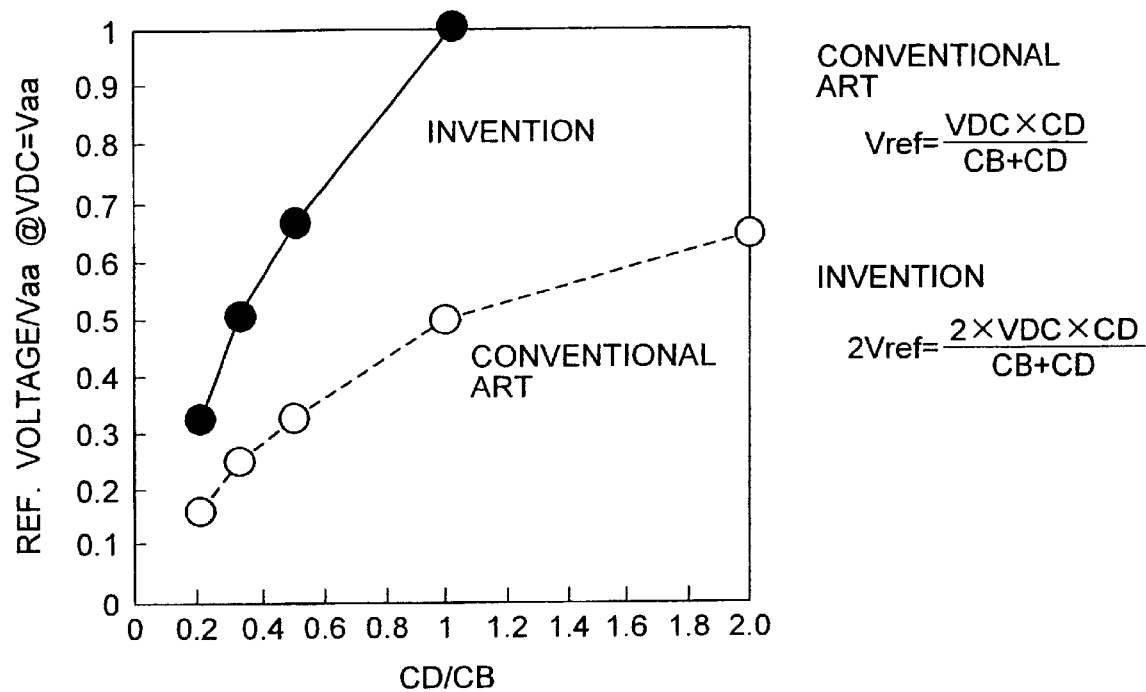
FIG. 3 is a graph that shows an effect of the first embodiment of the invention.

FIGS. 1 and 2 illustrate configuration of the first embodiment of the invention, in which FIG. 1 shows configuration of an array, sense amplifier and dummy cell circuit of the invention, and FIG. 2 is its operation timing chart. FIG. 3 is a diagram that shows its effect.

A single memory cell is made up of a cell transistor and a ferroelectric capacitor connected in parallel. A single memory cell block is made of serially connecting a plurality of such parallel-connected memory cells, with one end thereof being connected to a bit line via a block selecting transistor and the other end being connected to a plate. With this configuration, 4F2-size memory cells can be realized by using planar transistors.

As shown in FIG. 1, by providing two kinds of block selecting transistors and block selecting signals BS0, BS1 for /BL and BL, respectively, and rendering one of the block selecting transistors (BS0, B1) HIGH, folded bit lines can be realized, in which only one of data of the two cell blocks is read out to the bit line and the other of the pair of bit liens is used as a reference bit line, and a 1T/1C cell, which uses one cell transistor and one ferroelectric capacitor to store one-bit data can be made. Further, by preparing two kinds of plate lines and driving only one of the plate lines on the part of the selected bit line, application of a voltage to a non-selected cell on the reference side can be prevented.

Behaviors of the circuit are briefly explained. In a standby mode, all (sub)word lines WL0 through WL3 are held HIGH, memory cell transistors are held ON, the block selecting signals BS0, BS1 are set LOW, and the block selecting transistor is held OFF. In this manner, since opposite sides of the ferroelectric capacitor is electrically short-circuited by the cell transistors held ON, no potential difference is produced between opposite ends, and the memory polarization is maintained stably.

In an active mode, the pair of bit lines pre-charged to Vss are changed to the floating state. Then by turning off only the memory cell transistor connected in parallel to the ferroelectric capacitor to be read out, the block selection transistor is turned ON. For example, in case of selecting the ferroelectric memory cell capacitor MC1 in FIG. 1, WL2 is set LOW. After that, by setting the plate line PL0 on the part of MC1 HIGH and setting the block selecting signal BS0 on the part of MC1 HIGH, a potential difference between PL0 and /BL is applied only to opposite ends of the ferroelectric capacitor MC1 connected in parallel to the memory cell transistor having turned OFF, and polarization information of the ferroelectric capacitor is read out to the bitline /BL (/BLSA) having floated to Vss. Therefore, even with cells connected in series, by selecting a desired sub-word line, cell information of a desired ferroelectric capacitor can be read out, and fully random access is realized.

When data is "1", polarization reversal occurs in the ferroelectric capacitor, and the bit line is raised to a high potential (BLh). When data is "0", polarization reversal does not occur, but the bit line rises (BL1) as much as the paraelectric component of the ferroelectric capacitor and the capacitance ratio of the bit line capacitance. In this manner, although the bit line potential rises from Vss for both data "1" and "0", there is a difference between the potentials. Therefore, if the reference bit line BL (BLSA) can be adjusted to an intermediate potential between those potentials, it is possible to determine whether the cell data is "1" or "0" by amplifying the difference between the bit line and the reference bit line with the sense amplifier.

The dummy cell circuit that generates the reference bit line potential is configured by using the circuit as shown in FIG. 1.

In a standby mode, the transistors Q1, Q2 of the dummy word lines are turned OFF, and one end N1 of the paraelectric capacitor C1 is pre-charged to the source potential of Q3, i.e. VDC (>Vss) potential by holding the transistor Q3 ON. The dummy plate line DPL at the other end of the paraelectric capacitor is held at Vss potential. That is, the voltage VDC is applied to opposite ends of the paraelectric capacitor to have it hold the charge of CD×VDC.

In an active mode, a transistor of a dummy word line connected to the reference bit line, which is the transistor Q1 in this example, is turned ON to connect BL and N1. As a result, the charge stored in the paraelectric capacitor is discharged to the reference bit line. After that, potential of the dummy plate line DPL, which is the other end of C1, is raised from Vss to VDC' potential. Through these operations, a value corresponding to the charge of CD×VDC' is generated by coupling of the paraelectric capacitor C1, and the charge is shared by the reference bit line and the paraelectric capacitor.

Through the series of operations, the reference BL potential: Vref' can be raised from Vss to the intermediate potential between those corresponding to "1" and "0" data. As a result, the reference bit line potential becomes a value obtained by dividing the total charge =(CD×VDC'+CD×VDC) by the load capacitance (CD+CB).

In case of VDC=VDC', as shown in FIG. 2, it results in Vref'=(2CD×VDC)/(CD+CB)=2Vref=×2×(CD×VDC)/(CD+CB), and it is possible to generate a reference bit line potential double that of the conventional dummy cell system, i.e. Vref=(CD×VDC)/(CD+CB), with the same paraelectric capacitor capacitance.

From the opposite viewpoint, while the conventional system required a large CD value because Vref=½VDC when CD=CB, the first embodiment of the invention can use a dummy capacitor having an area only ⅓ of that of the conventional system because Vref'=½VDC when CD=⅓CB, and can reduce the chip size significantly.

For example, when CB=500 fF is employed, the conventional system requires the dummy capacitor capacitance of 500 fF, and a MOS capacitor having an 8 nm thick oxide film needs the capacitor area as large as 112 $\mu m^2$ per each dummy cell. In contrast, the first embodiment of the invention can significantly reduce the capacitor area per each dummy cell to 37 $\mu m^2$ with the capacitance of 500 fF/3=167fF.

Additionally, to generate a potential larger than ½VDC, CB<CD in the conventional system. Therefore, CD itself affects as a load capacitance, and it is possible to generate a potential. The first embodiment of the invention, however, can generate the potential as large as Vref'=VDC=Vaa when CD=CB. Therefore, the embodiment can realize ferroelectric memory without using a ferroelectric capacitor that decreases in operation margin due to fluctuations, deformations, and so on. At the same time, it can realize ferroelectric memory with a small dummy capacitor area without raising and lowering the plate twice. Therefore, high-speed operation is possible.

The first embodiment of the invention explained above is configured to share the paraelectric capacitor by the pair of bit lines and thereby reduce the dummy cell capacitor area. The paraelectric capacitor may be a gate capacitor of a MOS transistor. In this case, it is preferably a depletion-type transistor.

The dummy word lines DWL0, DWL1 may be changed to LOW prior to sensing operation to disconnect the dummy cell and the reference bit line as shown by (2) in the timing chart. It is also acceptable to do it after sensing operation (1). After that, the node reset signal DRST is changed to HIGH, and DPL is decreased to LOW after pre-charging the node N1 to VDC to return to the same status as the standby mode. It is preferable to raise DPL after changing DWL0 to HIGH and discharging a certain amount of the charge stored to the VDC voltage to the reference bit line. For simplicity of the circuit, VDC=VDC' is also desirable. Other methods are also usable, such as a method of fixing VDC=Vaa and changing only VDC' in potential to generate the reference bit line potential, a method of fixing VDC=Vaa and changing only VDC in potential to generate the reference bit line potential, and so forth. It is also preferable that the amplitude potential of the DRST signal is not lower than VDC+Vt for writing VDC at N1, i.e. the raised potential Vpp. Potential of DWL0 and DWL1 may be Vpp, or may be the Vaa amplitude if the reference bit line potential +Vt<Vaa.

FIGS. 4 through 7 are circuit diagrams that show configurations of driving circuits of respective control signals used in the circuit of FIG. 1.

Figure 4:
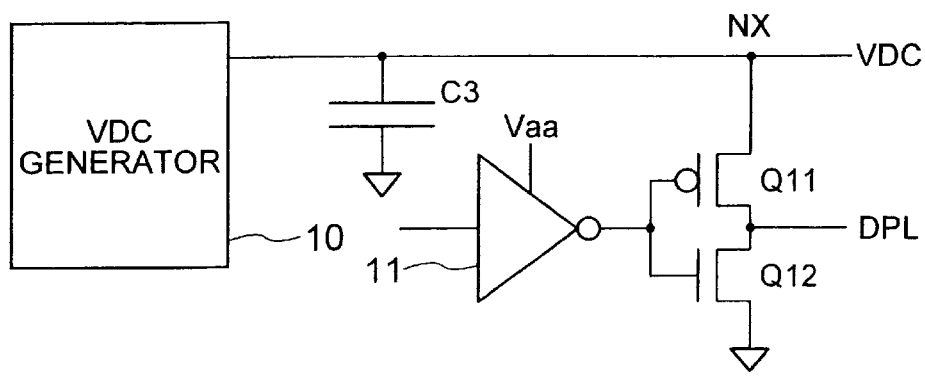
FIG. 4 is a circuit diagram that shows a control circuit of the dummy cell of FIG. 1.

The circuit shown in FIG. 4 is a circuit for driving the dummy cell source voltage VDC for pre-charging the node N1 and the dummy plate line DPL. A stable capacitance C3 is connected to Vss between a VDC generator 10 and the node N1. A PMOS transistor Q11 and an NMOS transistor Q12 are connected in series between the node Nx and Vss at the common connection point of these gates, an inverter 11 controlled by the HIGH-side potential Vss of the line amplitude is connected, and the connection point of both transistors gives the dummy plate line DPL a driving potential.

This is a circuit for the case of VDC=VDC' discussed above, and if Vaa≧VDC, output of the Vaa amplitude can be directly input to the driver of the VDC source.

Figure 5:
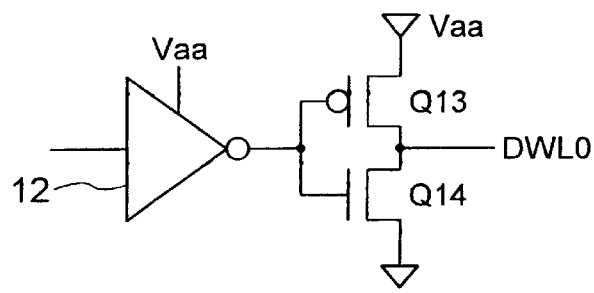
FIG. 5 is a circuit diagram that shows a generating circuit of DWL0.

FIG. 5 is a circuit diagram that shows configuration of a circuit for generating potential of the dummy word line DWL0.

This circuit is an example of generating circuit of a driving potential of the dummy word line DWL0, connecting a PMOS transistor Q13 and an NMOS transistor Q14 in series between the HIGH-side potential Vaa of the bit line amplitude and Vss, and connecting to the common junction of their gates an inverter 12 controlled by the HIGH-side potential Vaa of the bit line amplitude such that the junction of both transistors give the dummy word line DWL0 a driving potential. In this circuit, amplitude of the DWL0 driving potential is Vss.

Figure 6:
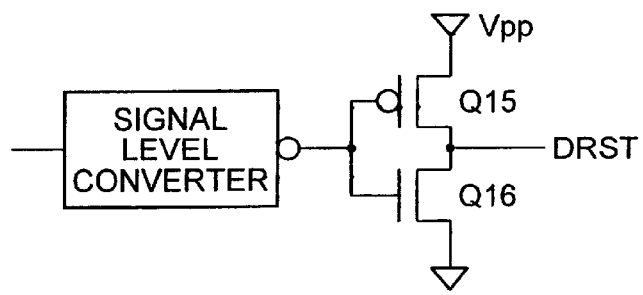
FIG. 6 is a circuit diagram that shows a drive circuit of a DRST signal.

FIG. 6 is a circuit diagram that shows an example of driving circuit of the node reset signal DRST.

In this circuit, a PMOS transistor Q15 and an NMOS transistor Q16 are serially connected between the raised potential Vpp and Vss, and an inverted output of the signal level converter is connected to the common junction of their gates such that the junction of both transistors supplies the DRST signal. The signal amplitude converter circuit is used to extend the amplitude of the DRST signal to VPP.

Figure 7:
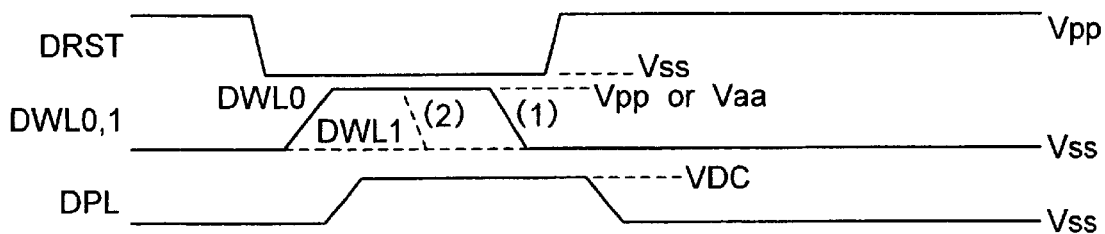
FIG. 7 is a timing chart that shows a relation among signals output in FIGS. 4 through 6.

FIG. 7 is a timing chart that shows a relation among signals output in FIGS. 4 through 6. Apparently, the relation is just the same as that shown in FIG. 2.

Figure 8:
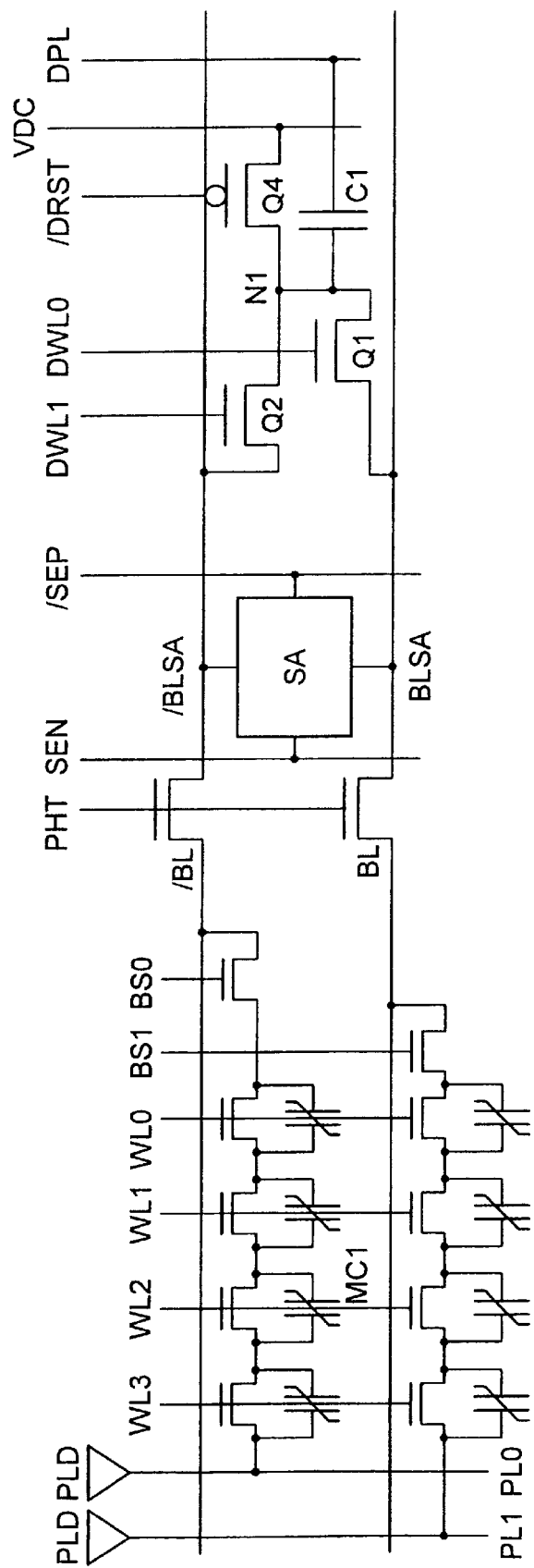
FIG. 8 is a circuit diagram that shows configuration of an array, sense amplifier and dummy cell circuit of ferroelectric memory taken as the second embodiment of the invention.
Figure 9:
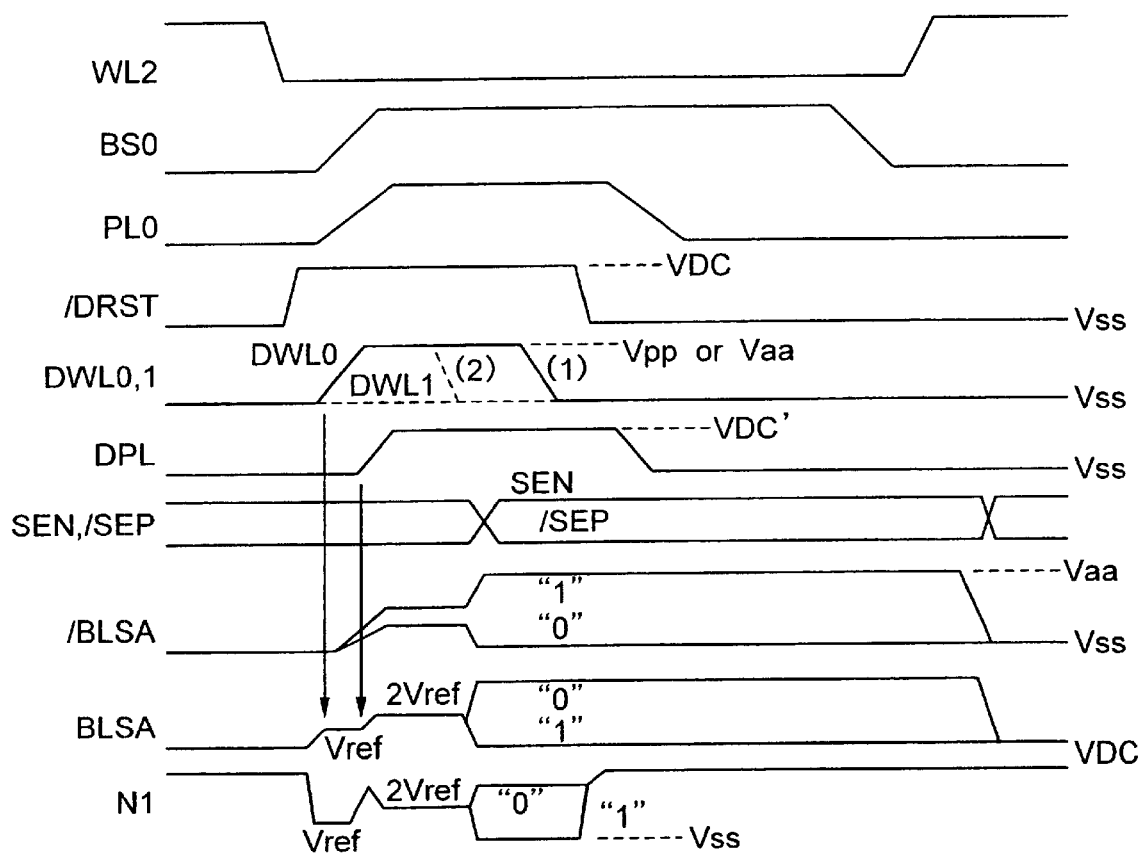
FIG. 9 is a timing chart that shows an example of operation timing of the circuit of FIG. 8.

FIG. 8 is a circuit diagram that shows configuration of an array, sense amplifier and dummy cell circuit of ferroelectric memory according to the second embodiment of the invention, and FIG. 9 is a timing chart showing their operations.

The circuit shown in FIG. 8 has substantially the same circuit configuration as FIG. 1, but it is different in that while the transistor Q3 of FIG. 1 for pre-charging the N1 node to VDC is NMOS, here is used PMOS and the opposite-phase signal/DRST is used in FIG. 8.

As shown in FIG. 9, this circuit has substantially the same operations as the circuit of FIG. 1. However, while the circuit of FIG. 1 has to raise or boost the DRST signal to Vaa in case of VDC+Vt>Vaa when pre-charging the N1 node to VDC, the circuit shown here, using PMOS, can pre-charge it to VDC by adjusting /DRST to Vss if VDC<Vaa, and it is possible to limit the amplitude of /DRST to Vaa and can remove the booster circuit.

Figure 10:
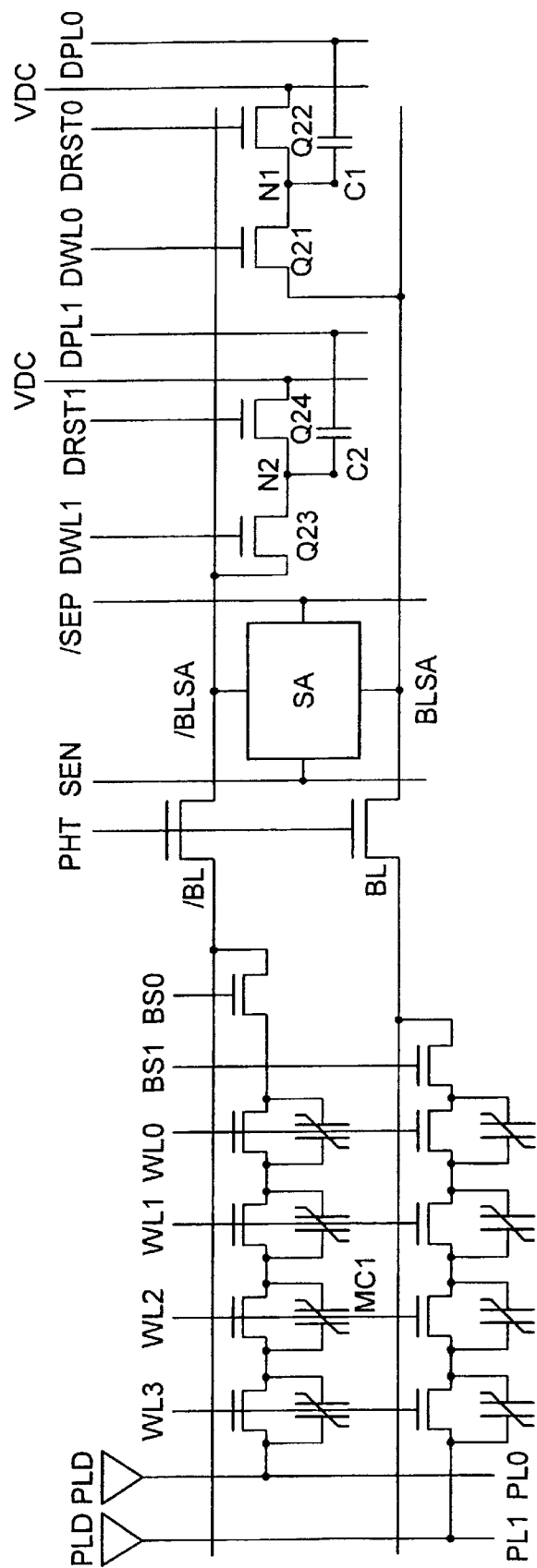
FIG. 10 is a circuit diagram that shows configuration of an array, sense amplifier and dummy cell circuit of ferroelectric memory taken as the third embodiment of the invention.
Figure 11:
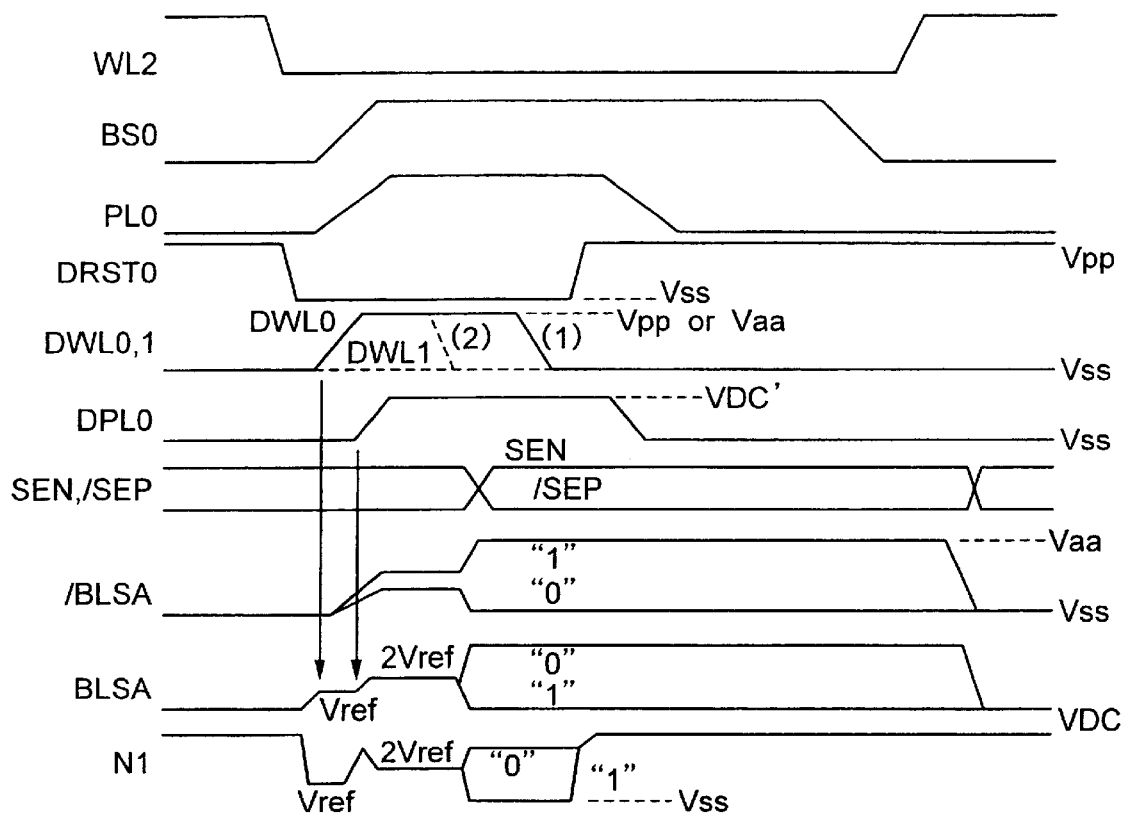
FIG. 11 is a timing chart that shows an example of operation timing of the circuit of FIG. 10.

FIGS. 10 and 11 show the third embodiment of the invention, in which FIG. 10 is its circuit diagram and FIG. 11 is a timing chart of its operations.

With reference to FIG. 10, the circuit arrangement is substantially the same as FIG. 1, but it is different in that the dummy cell circuit is provided for each of the pair or bit lines.

The first dummy cell circuit has a first paraelectric capacitor C1, and its first terminal is connected to the bit line BL via a transistor Q21 which is controlled by DWL0 and is connected to VDC via a transistor Q22 which is controlled by DRST0. The second terminal of the first paraelectric capacitor C1 is connected to DPL0. Similarly, the second dummy cell circuit has a second paraelectric capacitor C2, and its first terminal is connected to the bit line /BL via a transistor Q23 which is controlled by DWL1 and is connected to VDC via a transistor Q24 which is controlled by DRST1. The second terminal of the second paraelectric capacitor C2 is connected to DPL1.

In case that /BL is the reference bit line, DWL1, DRST1 and DPL1 may be activated. In case that BL is the reference bit line, DWL0, DRST0 and DPL0 may be activated.

Figure 12:
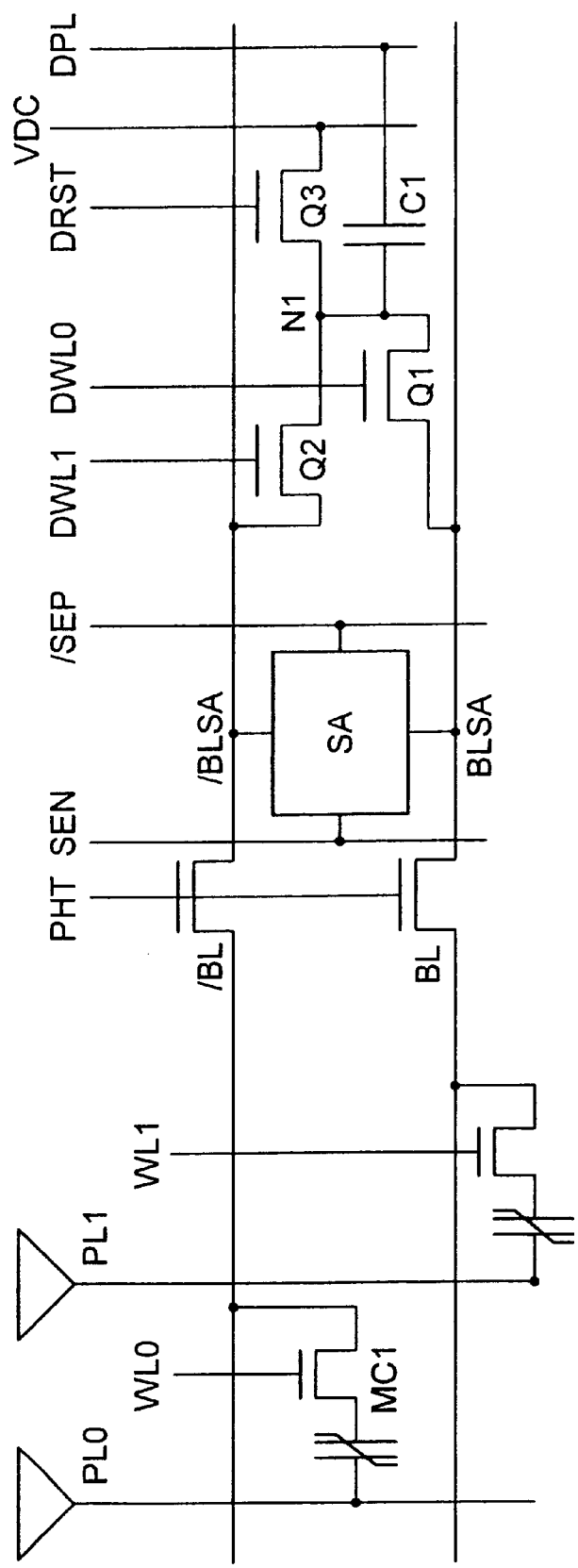
FIG. 12 is a circuit diagram that shows configuration of an array, sense amplifier and dummy cell circuit of ferroelectric memory taken as the fourth embodiment of the invention.
Figure 13:
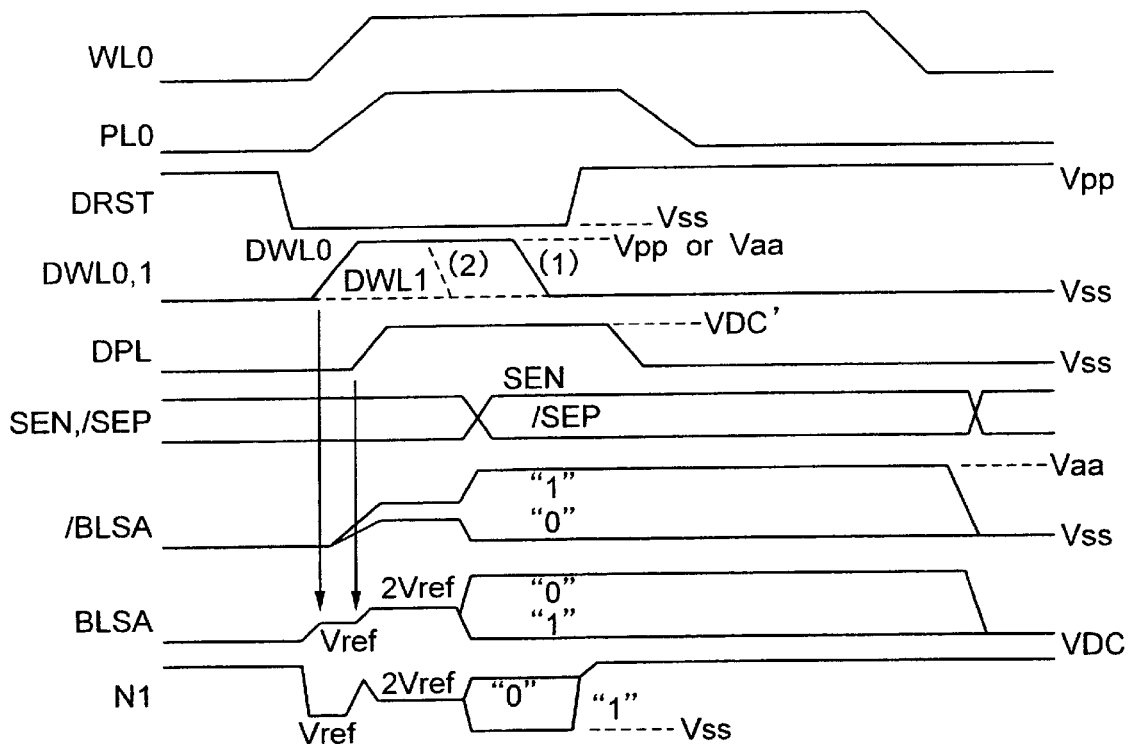
FIG. 13 is a timing chart that shows an example of operation timing of the circuit of FIG. 12.

FIGS. 12 and 13 show the fourth embodiment of the invention, in which FIG. 12 is its circuit diagram showing configuration of the array, sense amplifier and dummy cell circuit of the fourth embodiment of the invention and FIG. 13 is a timing chart of its operations.

With reference to FIG. 12, the instant embodiment relates to a dummy cell in a conventional type of ferroelectric memory. A single memory cell is of a 1T1C type made up of a cell transistor and a ferroelectric capacitor.

Behaviors of this circuit are briefly explained below. In a standby mode, all (sub)word lines WL0 through WL1 are set LOW, plate lines PL0 and PL1 are also set LOW, and the bit lines are pre-charged to Vss as well.

In an active mode, the pair of bit lines pre-charged to Vss are changed to the floating state. Then only the memory cell transistor connected in parallel to the ferroelectric capacitor to be read out is turned ON. For example, in case the ferroelectric memory cell capacitor MC1 in FIG. 12 is selected, WL0 is set HIGH. After that, when the plate line PL0 on the part of MC1 is set HIGH, a potential difference between PL0 and /BL is applied across opposite ends of the ferroelectric capacitor MC1, and polarization information of the ferroelectric capacitor is read out to the bit line /BL (/BLSA) held floating. Therefore, even with cells connected in series, cell information of any desired ferroelectric capacitor can be read out by selecting a desired (sub)word line, and absolutely random access is realized.

When data is "1", polarization reversal occurs in the ferroelectric capacitor, and the bit line is raised to a high potential (BLh). When data is "0", polarization reversal does not occur, but the bit line rises (BL1) as much as the paraelectric component of the ferroelectric capacitor and the capacitance ratio of the bit line capacitance. In this manner, although the bit line potential rises from Vss for both data "1" and "0" there is a difference between the potentials. Therefore, if the reference bit line BL (BLSA) can be adjusted to an intermediate potential between those potentials, it is possible to determine whether the cell data is "1" or "0" by amplifying the difference between the bit line and the reference bit line with the sense amplifier.

The dummy cell circuit that generates the reference bit line potential has the circuit arrangement as shown in FIG. 12.

In a standby mode, the transistors Q1, Q2 of the dummy word lines are turned OFF, and one end N1 of the paraelectric capacitor C1 is pre-charged to the source potential of Q3, i.e. VDC (>Vss) potential by holding the transistor Q3 ON. The dummy plate line DPL at the other end of the paraelectric capacitor is held at Vss potential. That is, the voltage VDC is applied to opposite ends of the paraelectric capacitor to have it hold the charge of CD×DVC.

In an active mode, a transistor of a dummy word line connected to the reference bit line, which is the transistor Q1 in this example, is turned ON to connect BL and N1. As a result, the charge stored in the paraelectric capacitor is discharged to the reference bit line. After that, potential of the dummy plate line DPL, which is the other end of C1, is raised from Vss to VDC' potential. Through these operations, a value corresponding to the charge of CD×VDC' is generated by coupling of the paraelectric capacitor C1, and the charge is shared by the reference bit line and the paraelectric capacitor. Through the series of operations, the reference BL potential: Vref can be raised from Vss to the intermediate potential between those corresponding to "1" and "0" data. As a result, the reference bit line potential becomes a value obtained by dividing the total charge =(CD×VDC'+CD×VDC) by the load capacitance (CD+CB).

In case of VDC=VDC', as shown in FIG. 3, it results in Vref'=(2CD×VDC)/(CD+CB)=2Vref=2×(CD×VDC)/(CD+CB), and it is possible to generate a reference bit line potential double that of the conventional dummy cell system, i.e. Vref=(CD×VDC)/(CD+CB), with the same paraelectric capacitor capacitance.

From the opposite viewpoint, while the conventional system required a large CD value because Vref=½VDC when CD=CB, according to the fourth embodiment of the present invention can use a dummy capacitor having an area only ⅓ of that of the conventional system because Vref'=½VDC when CD=⅓CB, and can reduce the chip size significantly. For example, when CB=1000 fF, the conventional system requires the dummy capacitor capacitance of 1000 fF, and a MOS capacitor having an 8 nm thick oxide film needs the capacitor area as large as 225 $\mu m^2$ per each dummy cell. In contrast, the first embodiment of the invention can significantly reduce the capacitor area per each dummy cell to 75 $\mu m^2$ with the capacitance of 1000 fF/3= 333 fF.

Additionally, to generate a potential larger than ½VDC, CB<CD in the conventional system. Therefore, CD itself affects as a load capacitance, and it is possible to generate a potential. According to the fourth embodiment of the present invention, however, the potential as large as Vref'=VDC= Vaa when CD=CB can be generated. This system enables realization of ferroelectric memory without using a ferroelectric capacitor that decreases in operation margin due to fluctuations, deformations, and so on. It can also realize ferroelectric with a small dummy capacitor area without raising and lowering the plate twice. Therefore, high-speed operation is possible.

The fourth embodiment of the present invention is configured to share the paraelectric capacitor by the pair of bit lines using the transistors Q1 and Q2 and thereby reduce the dummy cell capacitor area. The paraelectric capacitor may be a gate capacitor of a MOS transistor. A depletion-type transistor is preferable. The dummy word lines DWL0, DWL1 may be changed to LOW prior to sensing operation to disconnect the dummy cell and the reference bit line as shown by (2) in the timing chart shown in FIG. 13. It is also acceptable to do it after sensing operation (1). After that, DRST is changed to HIGH, and DPL is decreased to LOW after pre-charging the node N1 to VDC to return to the same status as the standby mode. It is preferable to raise DPL after changing DWL0 to HIGH and discharging a certain amount of the charge stored to the VDC voltage to the reference bit line. For simplicity of the circuit, VDC=VDC' is also desirable. Other methods are also usable, such as a method of fixing VDC=Vaa and changing only VDC' in potential to generate the reference bit line potential, a method of fixing VDC'=Vaa and changing only VDC in potential to generate the reference bit line potential, and so forth. It is also preferable that the amplitude potential of the DRST signal is not lower than VDC+Vt for writing VDC at N1, i.e. the raised potential Vpp. Potential of DWL0 and DWL1 may be Vpp, or may be the Vaa amplitude if the reference bit line potential +Vt<Vaa.

Needless to say, the driving circuits shown in FIGS. 4 through 6 are also applicable to the system of FIG. 12.

Figure 14:
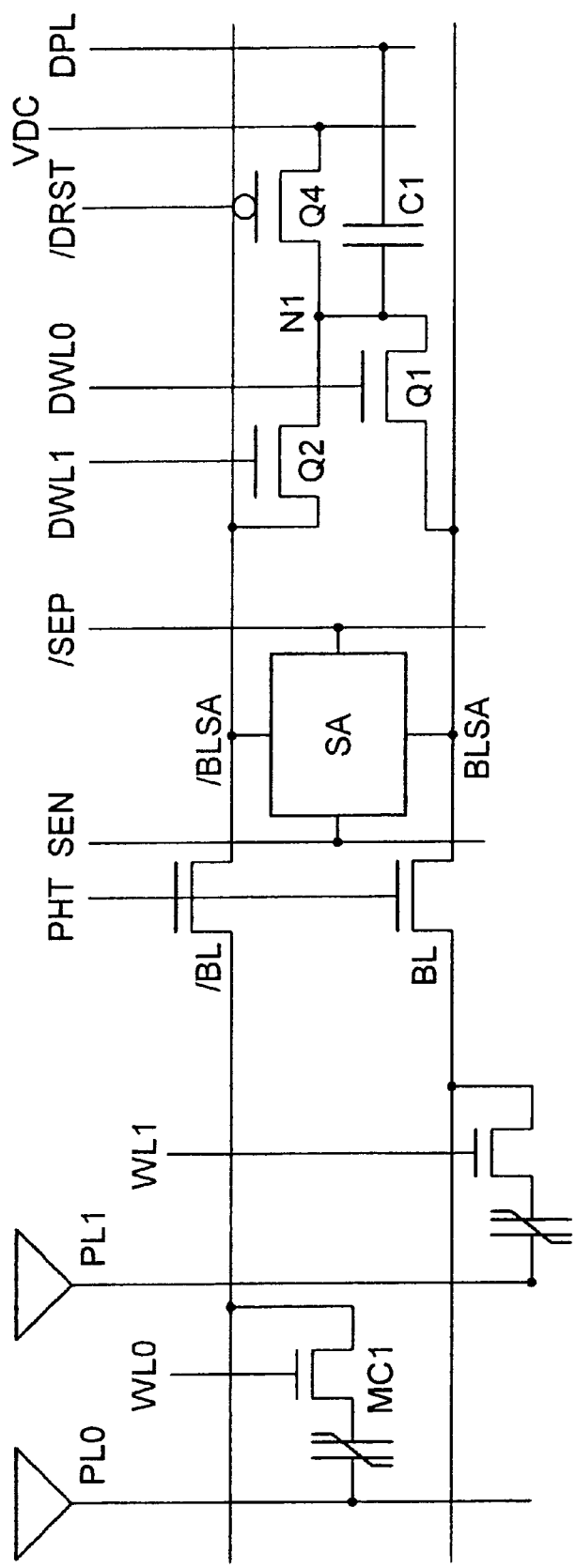
FIG. 14 is a circuit diagram that shows configuration of an array, sense amplifier and dummy cell circuit of ferroelectric memory taken as the fifth embodiment of the invention.
Figure 15:
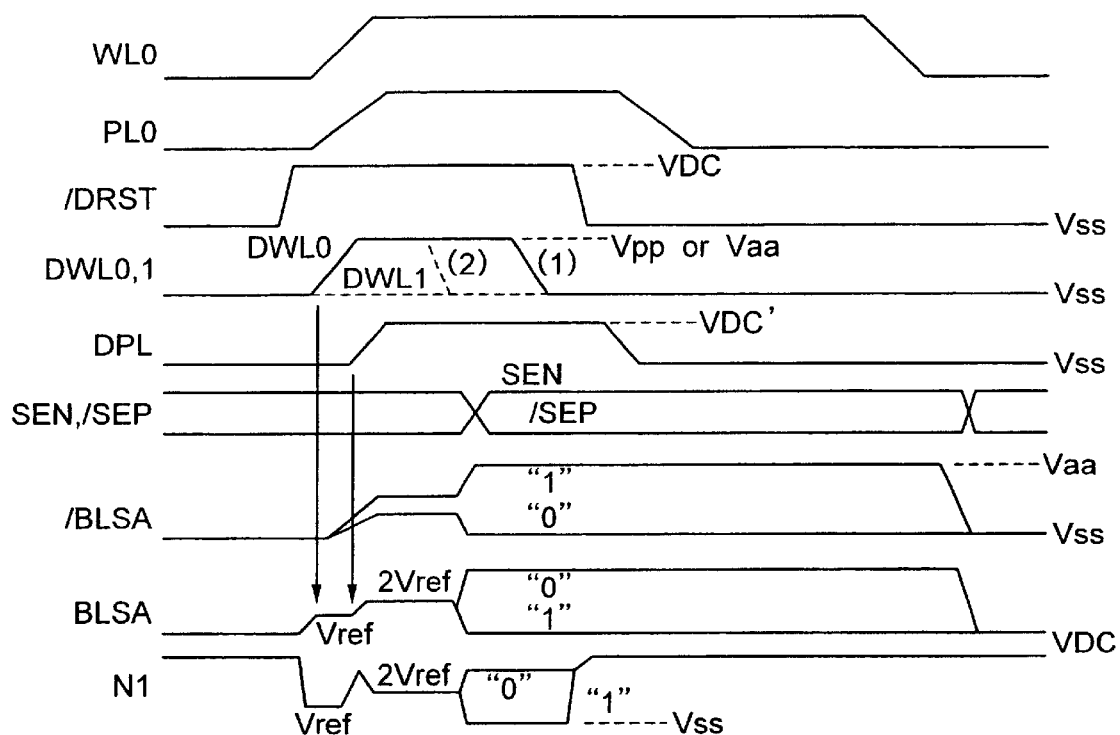
FIG. 15 is a timing chart that shows an example of operation timing of the circuit of FIG. 14.

FIG. 14 is a circuit diagram that shows the fifth embodiment of the invention, and FIG. 15 is a timing chart of its behaviors. This circuit has substantially the same circuit configuration as FIG. 12, but it is different in that while the transistor Q3 of FIG. 12 for pre-charging the N1 node to VDC is NMOS, the circuit of FIG. 16 uses PMOS and the opposite-phase signal /DRST.

For pre-charging the N1 node to VDC, the circuit of FIG. 12 has to raise or boost the DRST signal to above Vaa in case of VDC+Vt>Vaa. The circuit shown here, however, which uses PMOS, can pre-charge it to VDC by adjusting /DRST to Vss if VDC<Vaa, and it is possible to limit the amplitude of /DRST to Vaa and can remove the booster circuit.

Figure 16:
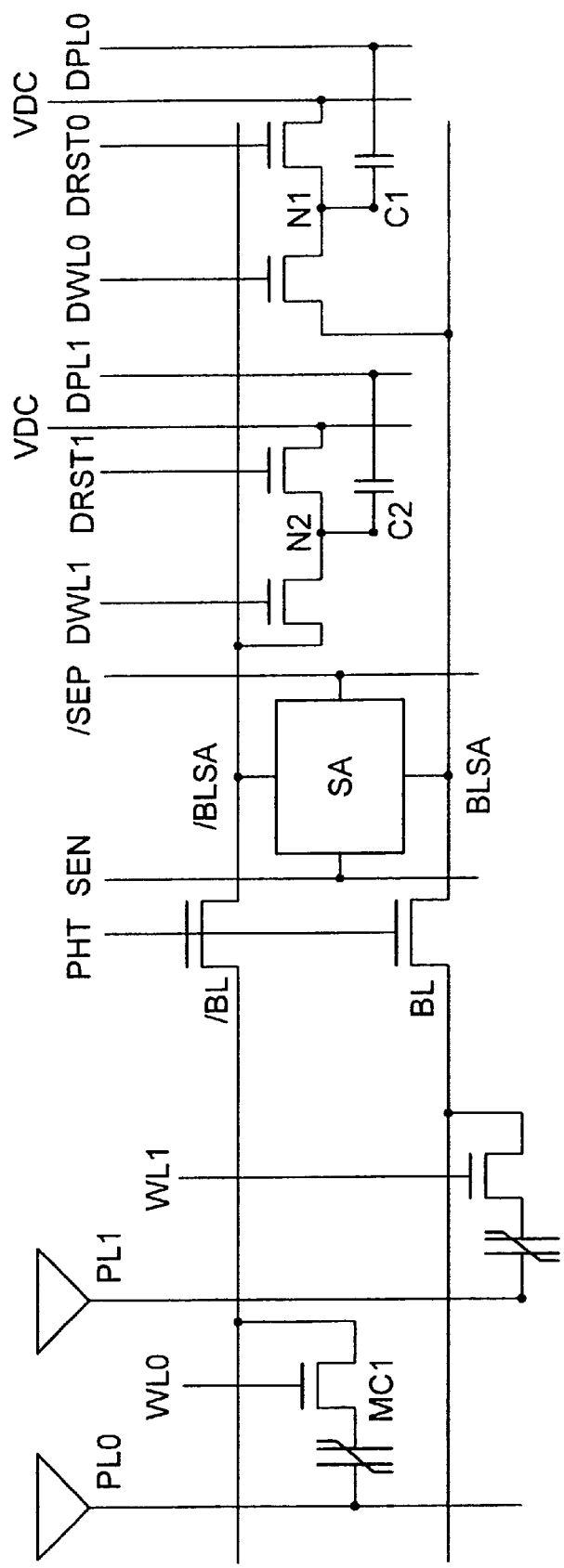
FIG. 16 is a circuit diagram that shows configuration of an array, sense amplifier and dummy cell circuit of ferroelectric memory taken as the sixth embodiment of the invention.
Figure 17:
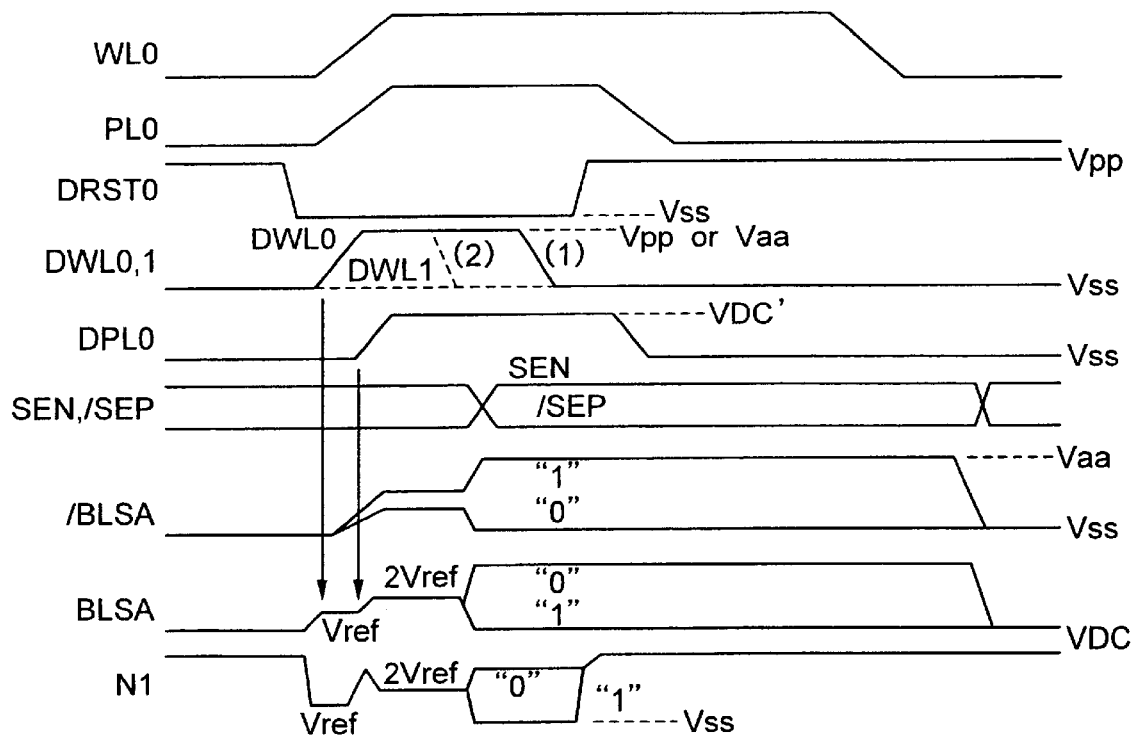
FIG. 17 is a timing chart that shows an example of operation timing of the circuit of FIG. 16.
Figure 18:
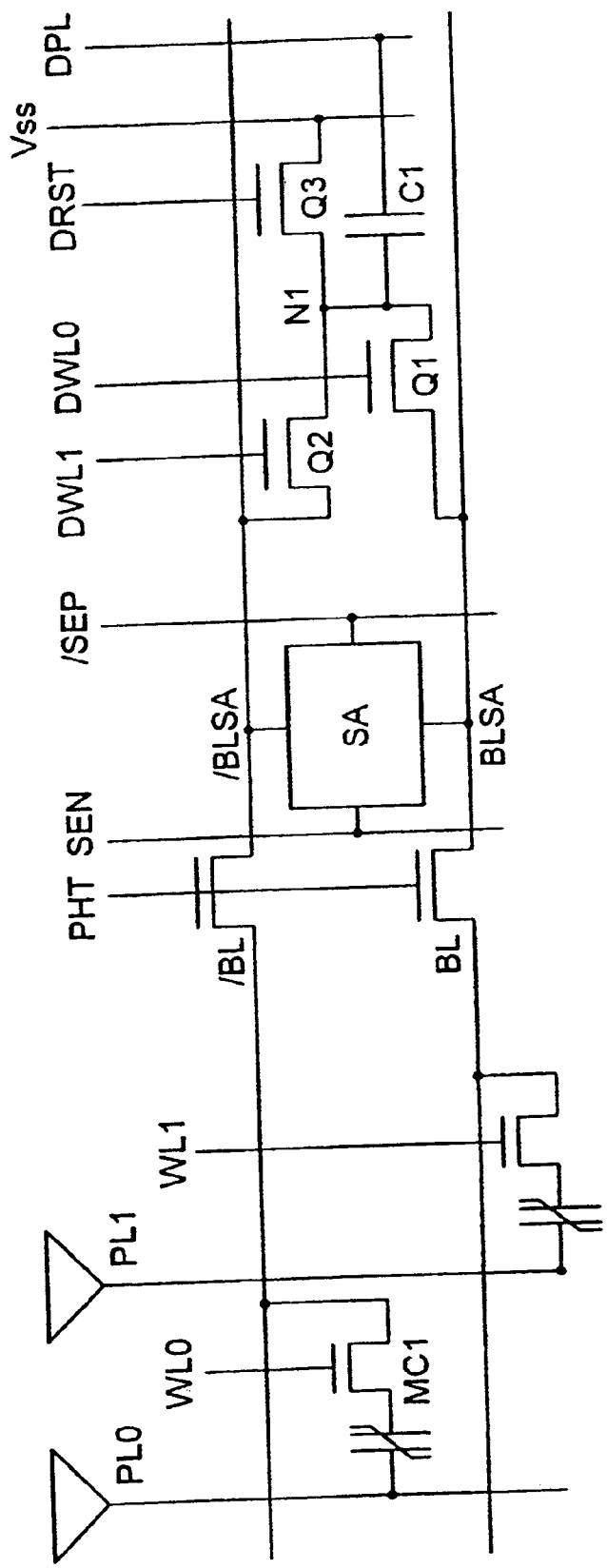
FIG. 18 is a circuit diagram that shows configuration of an array, sense amplifier and dummy cell circuit of ferroelectric memory by a conventional technique.
Figure 19:
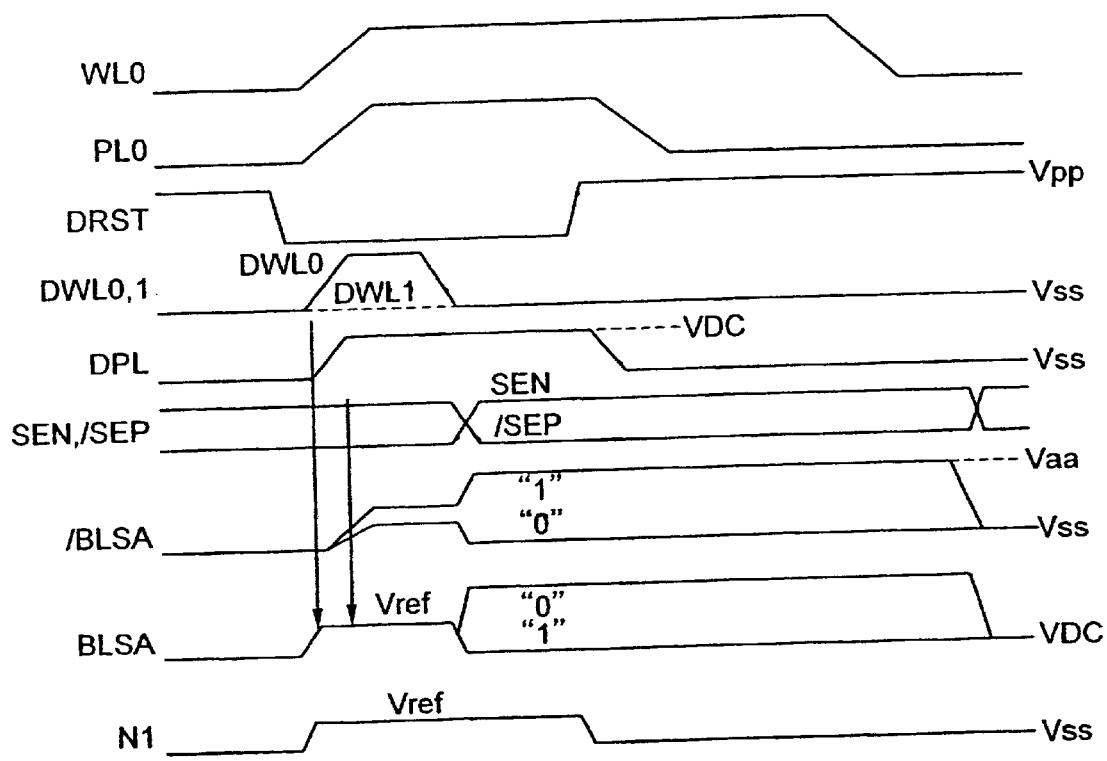
FIG. 19 is a timing chart that shows an example of operation timing of the circuit of FIG. 18.
Figure 20:
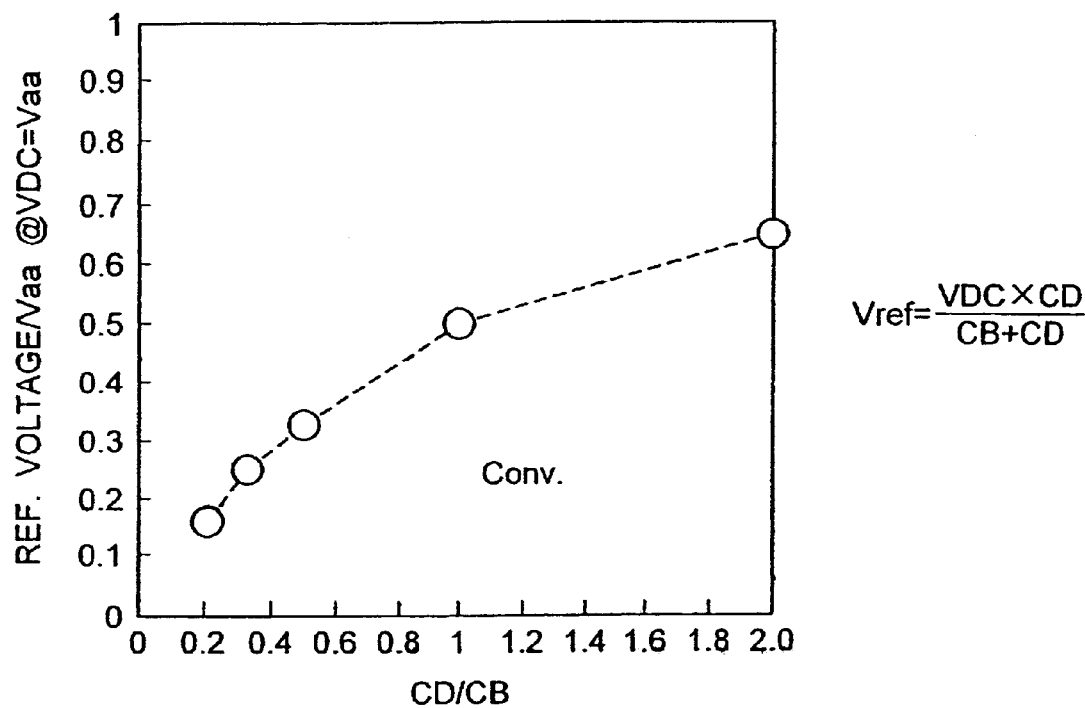
FIG. 20 is a graph that shows values of a reference bit line potential Vref in a conventional dummy cell circuit.
Figure 21:
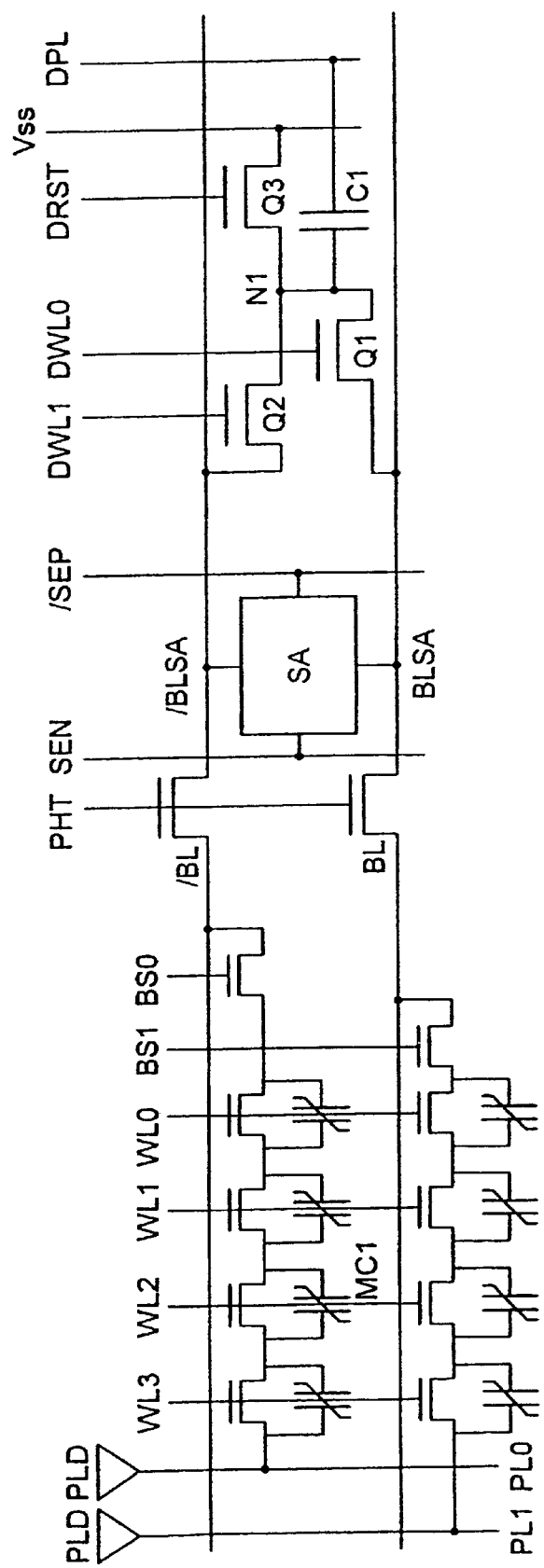
FIG. 21 is a circuit diagram that shows configuration of ferroelectric memory of an earlier application.
Figure 22:
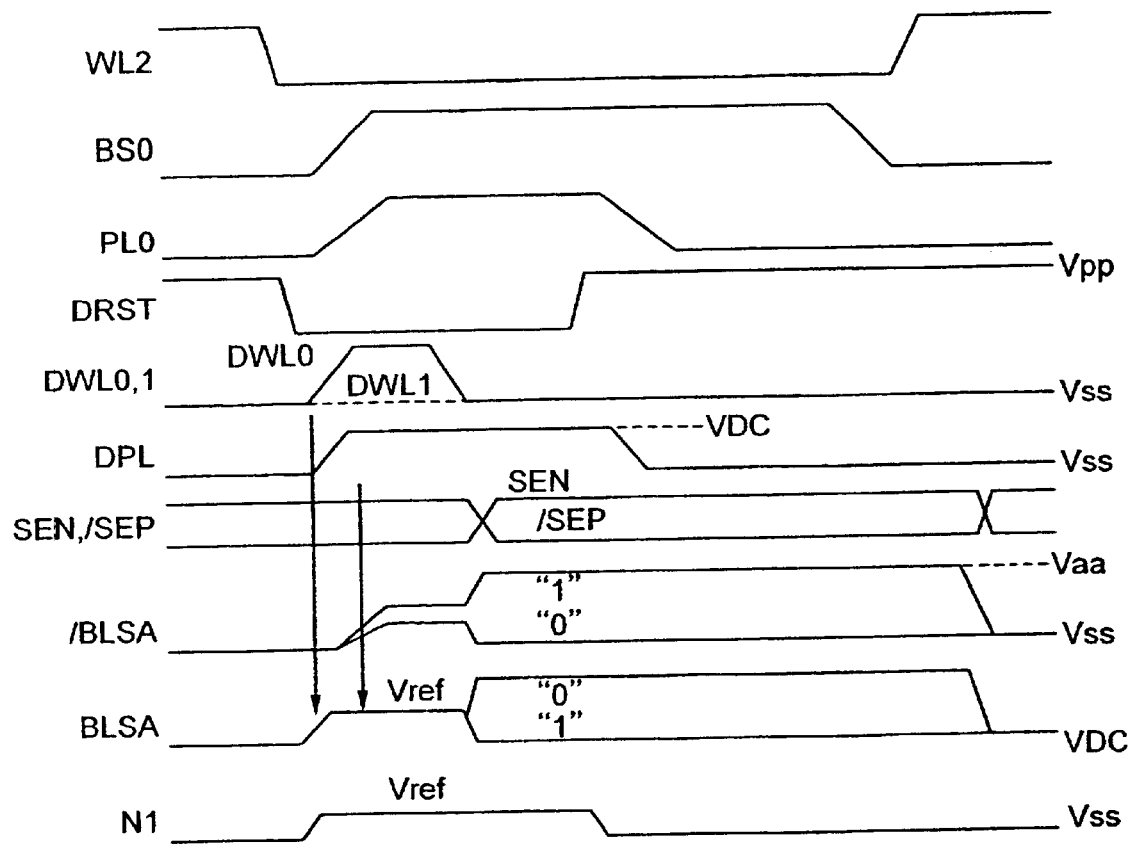
FIG. 22 is a timing chart that shows an example of operations in FIG. 21.

FIG. 16 is a circuit diagram that shows the sixth embodiment of the invention, and FIG. 17 is a timing chart of its behaviors.

The circuit shown in FIG. 16 has substantially the same circuit configuration as FIG. 12, but it is different in that the dummy cell circuit is provided for each of the pair of two bit lines. If /BL is the reference bit line, DWL, DRST1 and DPL1 may be activated. If BL is the reference bit line, DWL0, DRST0 and DPL0 may be activated.

As described above, since the invention controls the potential applied to the terminal of the paraelectric capacitor of the dummy cell to an optimum value in either a standby mode or an active mode, it can realize ferroelectric memory not requiring a ferroelectric capacitor subjected to large fluctuations and liable to decrease in operation margin due to deformation, for example, and can realize ferroelectric memory with a small dummy capacitor area without the need of raising and lowering the plate potential in an complicated manner. Therefore, it enables high-speed operation.

What is claimed is:

1. A semiconductor memory device comprising:
a plurality of memory cell blocks each including a serial connection of at least a plurality of memory cells each including a cell transistor and a ferroelectric capacitor connected in parallel between source and drain terminals of said cell transistor;
a plurality of word lines connected to said cell transistors;
a plurality of bit line pairs connected to said memory cell blocks;
a plurality of amplifier circuits connected to said bit line pairs to amplify a signal difference between bit lines in each of said bit line pair; and
a dummy cell circuit to generate a potential for one of said bit line pair, which is a reference bit line to which data is not read out from said memory cells, said dummy cell circuit including at least one paraelectric capacitor;
wherein in a standby mode, a first terminal of said paraelectric capacitor is pre-charged to a first potential higher than ground potential, and a second terminal of said paraelectric capacitor is pre-charged to ground potential; and in an active mode, said first terminal is connected to said reference bit line, and said second terminal is raised from ground potential to a second potential higher than ground potential.

2. The semiconductor memory device according to claim 1, wherein said first terminal is connected to one of bit lines in each said bit line pair via a first transistor, connected to the other of bit lines in each said bit line pair via a second transistor, and connected to said first potential via a third transistor.

3. The semiconductor memory device according to claim 2, wherein said third transistor operates in the opposite phase from that of said first and second transistors.

4. The semiconductor memory device according to claim 1, wherein said first terminal is connected to one of bit lines of each said bit line pair via a first transistor, and connected to said first potential via a third transistor.

5. The semiconductor memory device according to claim 4, wherein said third transistor operates in the opposite phase from that of said first transistor.

6. The semiconductor memory device according to claim 1, wherein said first potential and said second potential are equal.

7. The semiconductor memory device according to claim 1, wherein said second terminal is raised from ground potential to said second potential higher than ground potential after said first terminal is connected to said reference bit line.

8. A semiconductor memory device comprising:
a plurality of memory cell blocks each including a serial connection of at least a plurality of memory cells each including a cell transistor and a ferroelectric capacitor connected in parallel between source and drain terminals of said cell transistor;
a plurality of word lines connected to said cell transistors;
a plurality of bit line pairs connected to said memory cell blocks;
a plurality of amplifier circuits connected to said bit line pairs to amplify a signal difference between bit lines in each of said bit line pair; and
a dummy cell circuit including a first dummy cell portion having a first paraelectric capacitor to generate a first potential of a first bit line of said bit line pair and a second dummy cell portion having a second paraelectric capacitor to generate a second potential of a second bit line of said bit line pair,
wherein a first terminal of the first paraelectric capacitor is connected to the first bit line via a first transistor and to a first dummy cell power supply potential via a second transistor, and a second terminal of the first paraelectric capacitor is connected to a first dummy plate line, and a first terminal of the second paraelectric capacitor is connected to the second bit line via a third transistor and to a second dummy cell power supply potential via a fourth transistor, and a second terminal of the second paraelectric capacitor is connected to a second dummy plate line.

9. The semiconductor memory device according to claim 8, wherein in the case where said first bit line is reference bit line, the first and second transistors are controlled, and in the case where said second bit line is reference bit line, the third and fourth are controlled.

10. The semiconductor memory device according to claim 9, wherein in a standby mode, a first terminal of said first and second paraelectric capacitor is pre-charged to a first potential higher than ground potential, and a second terminal of said selected paraelectric capacitor is pre-charged to ground potential; and in an active mode, said first terminal of the selected paraelectric capacitor is connected to said reference bit line, and said second terminal of the selected paraelectric capacitor is raised from ground potential to a second potential higher than ground potential.

11. A semiconductor memory device comprising:
a plurality of memory cells made up of a serial connection of cell transistors and ferroelectric capacitors;
a plurality of word lines connected to said cell transistors;
a plurality of bit line pairs connected to said memory cells;
a plurality of amplifier circuits connected to said bit line pairs to amplify a signal difference between bit lines in each said bit line pair; and
a dummy cell circuit for generating a potential in one of bit lines in each said bit line pair, which is a reference bit line to which data is not read out from memory cells, said dummy cell circuit having at least one paraelectric capacitor;
wherein in a standby mode, a first terminal of said paraelectric capacitor being pre-charged to a first potential higher than ground potential, and a second terminal of said paraelectric capacitor being pre-charged to ground potential; and
in an active mode, said first terminal being connected to said reference bit line, and said second terminal being raised from ground potential to a second potential higher than ground potential.

12. The semiconductor memory device according to claim 11, wherein said first terminal is connected to one of bit lines of each said bit line pair via a first transistor, and connected to said first potential via a third transistor.

13. The semiconductor memory device according to claim 12, wherein said third transistor operates in the opposite phase from that of said first transistor.

14. The semiconductor memory device according to claim 11, wherein said first terminal is connected to one of bit lines in each said bit line pair via a first transistor, connected to the other of bit lines in each said bit line pair via a second transistor, and connected to said first potential via a third transistor.

15. The semiconductor memory device according to claim 14, wherein said third transistor operates in the opposite phase from that of said first and second transistors.

16. The semiconductor memory device according to claim 11, wherein said first potential and said second potential are equal.

17. The semiconductor memory device according to claim 11, wherein said second terminal is raised from ground potential to said second potential higher than ground potential after said first terminal is connected to said reference bit line.

18. A semiconductor memory device comprising:
a plurality of memory cells each including a serial connection of a cell transistor and a ferroelectric capacitor;
a plurality of word lines connected to said cell transistors;
a plurality of bit line pairs connected to said cell transistors;
a plurality of amplifier circuits connected to said bit line pairs to amplify a signal difference between bit lines in each of said bit line pair; and
a dummy cell circuit to generate a potential for one of said bit line pair, which is a reference bit line to which data is not read out from said memory cells, said dummy cell circuit including at least one paraelectric capacitor;
wherein in a standby mode, a first terminal of said paraelectric capacitor is pre-charged to a first potential higher than ground potential, and a second terminal of said paraelectric capacitor is pre-charged to ground potential; and
in an active mode, said first terminal is connected to said reference bit line, and said second terminal is raised from ground potential to a second potential higher than ground potential.

19. The semiconductor memory device according to claim 18, wherein said first terminal is connected to one of bit lines in each said bit line pair via a first transistor, connected to the other of bit lines in each said bit line pair via a second transistor, and connected to said first potential via a third transistor.

20. The semiconductor memory device according to claim 19, wherein said third transistor operates in the opposite phase from that of said first and second transistors.

21. The semiconductor memory device according to claim 18, wherein said first terminal is connected to one of bit lines of each said bit line pair via a first transistor, and connected to said first potential via a third transistor.

22. The semiconductor memory device according to claim 21, wherein said third transistor operates in the opposite phase from that of said first transistor.

23. The semiconductor memory device according to claim 18, wherein said first potential and said second potential are equal.

24. The semiconductor memory device according to claim 18, wherein said second terminal is raised from ground potential to said second potential higher than ground potential after said first terminal is connected to said reference bit line.

25. A semiconductor memory device comprising:
a plurality of memory cells each including a serial connection of a cell transistor and a ferroelectric capacitor;
a plurality of word lines connected to said cell transistors;
a plurality of bit line pairs connected to said memory cells;
a plurality of amplifier circuits connected to said bit line pairs to amplify a signal difference between bit lines in each of said bit line pair; and
a dummy cell circuit including a first dummy cell portion having a first paraelectric capacitor to generate a first potential of a first bit line of said bit line pair and a second dummy cell portion having a second paraelectric capacitor to generate a second potential of a second bit line of said bit line pair,
wherein a first terminal of the first paraelectric capacitor is connected to the first bit line via a first transistor and to a first dummy cell power supply potential via a second transistor, and a second terminal of the first paraelectric capacitor is connected to a first dummy plate line, and
a first terminal of the second paraelectric capacitor is connected to the second bit line via a third transistor and to a second dummy cell power supply potential via a fourth transistor, and a second terminal of the second paraelectric capacitor is connected to a second dummy plate line.

26. The semiconductor memory device according to claim 25, wherein in the case where said first bit line is a reference bit line, the first and second transistors are controlled, and in the case where said second bit line is the reference bit line, the third and fourth are controlled.

27. The semiconductor memory device according to claim 26, wherein in a standby mode, a first terminal of said first and second paraelectric capacitor is pre-charged to a first potential higher than ground potential, and a second terminal of said selected paraelectric capacitor is pre-charged to ground potential; and in an active mode, said first terminal of the selected paraelectric capacitor is connected to said reference bit line, and said second terminal of the selected paraelectric capacitor is raised from ground potential to a second potential higher than ground potential.

* * * * *

UNITED STATES PATENT AND TRADEMARK OFFICE
CERTIFICATE OF CORRECTION

PATENT NO. : 6,574,133 B2
DATED : June 3, 2003
INVENTOR(S) : Daisaburo Takashima It is certified that error appears in the above-identified patent and that said Letters Patent is hereby corrected as shown below:

<u>Title page,</u>
Item [73], Assignee, "Kawasaki" should read -- Minato-ku --.

Signed and Sealed this

Twentieth Day of April, 2004

JON W. DUDAS
*Acting Director of the United States Patent and Trademark Office*